(12) United States Patent
Wallrafen

(10) Patent No.: US 10,816,361 B2
(45) Date of Patent: Oct. 27, 2020

(54) ARRANGEMENT FOR DETECTING THE ANGULAR POSITION OF A ROTATABLE COMPONENT

(71) Applicant: Continental Automotive GmbH, Hannover (DE)

(72) Inventor: Werner Wallrafen, Hattersheim (DE)

(73) Assignee: Vitesco Technologies GmbH, Hannover (DE)

(*) Notice: Subject to any disclaimer, the term of this patent is extended or adjusted under 35 U.S.C. 154(b) by 0 days.

(21) Appl. No.: 15/999,273

(22) PCT Filed: Jan. 31, 2017

(86) PCT No.: PCT/EP2017/052057
§ 371 (c)(1),
(2) Date: Aug. 17, 2018

(87) PCT Pub. No.: WO2017/140495
PCT Pub. Date: Aug. 24, 2017

(65) Prior Publication Data
US 2019/0186955 A1 Jun. 20, 2019

(30) Foreign Application Priority Data
Feb. 17, 2016 (DE) .......................... 10 2016 202 378

(51) Int. Cl.
*G01R 33/06* (2006.01)
*G01D 5/14* (2006.01)
*G01D 5/244* (2006.01)

(52) U.S. Cl.
CPC .......... *G01D 5/145* (2013.01); *G01D 5/24438* (2013.01); *G01R 33/06* (2013.01); *G01D 5/24471* (2013.01)

(58) Field of Classification Search
CPC .... G01D 5/142; G01D 5/145; G01D 5/24438; G01D 5/24471; G01D 5/245;
(Continued)

(56) References Cited

U.S. PATENT DOCUMENTS 6,288,533 B1    9/2001  Haeberli et al.
6,502,183 B2   12/2002  Vlot et al.
(Continued)

FOREIGN PATENT DOCUMENTS

DE       69816775 T2     5/2004
DE    102009042473 A1    4/2011
(Continued)

OTHER PUBLICATIONS

Third Party Observation dated Jul. 22, 2019 issued in European Patent Application No. 17704409.6.

*Primary Examiner* — David M Schindler
(74) *Attorney, Agent, or Firm* — Cozen O'Connor

(57) ABSTRACT

An arrangement for detecting the angular position of a rotatable component includes: a magnet, configured to generate a magnetic field, and a sensor assembly, configured to detect the magnetic field, and to supply therefrom an angle signal corresponding to the angular position of the component. The sensor assembly has a first sensor group, including a first magnetically sensitive element, a second magnetically sensitive element, and a third magnetically sensitive element, a second sensor group, having a fourth magnetically sensitive element, a fifth magnetically sensitive element, and a sixth magnetically sensitive element, and an evaluation unit, which is connected to each of the magnetically sensitive elements of the first sensor group and the magnetically sensitive elements of the second sensor group and supplies the angle signal corresponding to the angular position of the component.

10 Claims, 2 Drawing Sheets

(58) Field of Classification Search
CPC ...... G01R 33/06; G01R 33/07; G01R 33/072; G01R 33/075; G01R 33/077; G01R 33/09; G01R 33/091; G01R 33/093; G01R 33/095; G01R 33/098; G01B 7/14; G01B 7/30

See application file for complete search history.

(56) References Cited

U.S. PATENT DOCUMENTS

| | | |
|---|---|---|
| 9,080,896 B2 | 7/2015 | Wallrafen |
| 10,006,969 B2 | 6/2018 | Kaufmann et al. |
| 10,018,684 B2 | 7/2018 | Kaufmann et al. |
| 2004/0095129 A1* | 5/2004 | Furlong ............... G01D 5/145 324/207.2 |
| 2009/0115409 A1* | 5/2009 | Arinaga ............... G01D 5/145 324/207.25 |
| 2011/0291650 A1* | 12/2011 | Franke ............... G01D 5/145 324/251 |
| 2012/0038359 A1* | 2/2012 | Saruki ............... B82Y 25/00 324/252 |
| 2014/0225596 A1* | 8/2014 | Nakamura ............ G01R 33/07 324/207.2 |
| 2014/0253106 A1* | 9/2014 | Granig ............... G01R 33/06 324/207.14 |
| 2015/0066426 A1* | 3/2015 | Hirota ............... G01B 7/30 702/151 |
| 2015/0276893 A1 | 10/2015 | Kaufmann et al. |
| 2016/0011010 A1 | 1/2016 | Muthers |
| 2017/0030742 A1* | 2/2017 | Mochizuki ........... G01D 5/145 |
| 2018/0052208 A1* | 2/2018 | Onaka ............... G01R 33/0005 |

FOREIGN PATENT DOCUMENTS

| | | |
|---|---|---|
| DE | 102004064185 B4 | 4/2013 |
| DE | 102015001553 B3 | 8/2015 |
| DE | 102014005247 A1 | 10/2015 |
| EP | 0916074 A1 | 5/1999 |
| GB | 2505226 A | 2/2014 |
| WO | WO 2011036196 A1 | 3/2011 |
| WO | WO 2016139135 A1 | 9/2016 |

* cited by examiner

ARRANGEMENT FOR DETECTING THE ANGULAR POSITION OF A ROTATABLE COMPONENT

CROSS-REFERENCE TO RELATED APPLICATIONS

This is a U.S. national stage of application No. PCT/EP2017/052057 filed on 31 Jan. 2017, which claims priority to the Germany Application No. 10 2016 202 378.0 filed 17 Feb. 2016, the content of both incorporated herein by reference.

BACKGROUND OF THE INVENTION

1. Field of the Invention

The present invention relates to an arrangement (i.e., assembly) for capturing the angular position of a component that is rotatable about an axis of rotation.

2. Related Art

The use of magnet-based angle sensors for capturing the angular position of a component that is rotatable about an axis of rotation is known. By way of example GB 2 505 226 A discloses an arrangement, a method and a sensor for measuring an angular position using a multi-pole magnet with compensation of magnetic disturbance/interference fields. The arrangement disclosed therein has a multi-pole-pair magnet attached to a rotor and a stationary sensor. The sensor comprises a plurality of sensor elements arranged on a circle, the sensor elements being arranged substantially in two groups for measuring the magnetic field components that are effective parallel to the sensor plane. Homogeneous magnetic disturbance/interference fields can be largely compensated by the arrangement disclosed therein. However, the usable angular measuring range is restricted by the segmented multi-pole-pair magnet, and so it is only possible to capture a range of 360° divided by the number of pole pairs of the magnet.

Further, EP 0 916 074 B1, US 2015/276893 A1, DE 10 2015 001 553 B3, DE 10 2014 005 247 A1, DE 10 2004 064 185 B4 and DE 698 16 755 T2 have each disclosed apparatuses for capturing the angular position of a rotatable component. These disclosures, too, are based on forming a difference for suppressing magnetic disturbance/interference fields. Here, parallel components of the magnetic field are captured and, therefore, it is also only those magnetic field components that act orthogonal to the sensor plane that are measured. Magnetically sensitive sensors, such as, e.g., magnetoresistive sensors or vertical Hall cells, which measure parallel to the sensor plane, cannot be used.

Magnetic disturbance/interference fields can be produced by proximate permanent magnets, electromagnets, or else by a power line extending in the vicinity. Within the scope of the electrification of vehicles, in particular in view of, e.g., the 48 V vehicle electric system, in which currents of up to 1000 ampere may occur, magnetic disturbance/interference fields are increasingly superposed on the magnetic used field source, the magnetic disturbance/interference fields influencing the signal of the sensor and consequently being able to falsify the measurements of the magnetic rotary encoder.

SUMMARY OF THE INVENTION

An object of the present invention is to provide an arrangement with which the angular position of a component that is rotatable about an axis of rotation can be captured reliably, as accurately as possible and over an angular measurement range of 360°, the arrangement being robust in relation to magnetic disturbance/interference fields.

According to one aspect of the present invention an arrangement is provided for capturing the angular position of a component that is rotatable about an axis of rotation, the arrangement having a magnet that is configured to produce a magnetic field. The arrangement further has a sensor assembly, which is spaced apart from the magnet and configured to capture the magnetic field of the magnet in a measuring plane and supply an angle signal corresponding to the angular position of the component therefrom.

Here, the magnet and the sensor assembly are arranged with respect to one another so as to be rotatable about the rotatable axis such that a relative rotational movement is facilitated between the magnet and the sensor assembly. The sensor assembly comprises a first sensor group arranged in the measuring plane, the first sensor group having a first magnetically sensitive element arranged at a predetermined distance from the axis of rotation, a second magnetically sensitive element arranged opposite to the first magnetically sensitive element relative to the axis of rotation, the second magnetically sensitive element being arranged at the predetermined distance from the axis of rotation, and a third magnetically sensitive element arranged centrally between the first magnetically sensitive element and the second magnetically sensitive element. The first magnetically sensitive element, the second magnetically sensitive element and the third magnetically sensitive element are each configured to capture the magnetic field along a first direction. The sensor assembly further comprises a second sensor group arranged in the measuring plane, the second sensor group having a fourth magnetically sensitive element arranged at the predetermined distance from the axis of rotation, a fifth magnetically sensitive element arranged opposite to the fourth magnetically sensitive element relative to the axis of rotation, the fifth magnetically sensitive element being arranged at the predetermined distance from the axis of rotation, and a sixth magnetically sensitive element arranged centrally between the fourth magnetically sensitive element and the fifth magnetically sensitive element. The fourth magnetically sensitive element, the fifth magnetically sensitive element and the sixth magnetically sensitive element are each configured to capture the magnetic field along a second direction that extends at a predetermined angle with respect to the first direction. Here, the first direction and the second direction each extend in the measuring plane. The sensor assembly moreover comprises an evaluation unit, which is connected to the magnetically sensitive elements of the first sensor group and to the magnetically sensitive elements of the second sensor group and configured to supply the angle signal corresponding to the angular position of the component.

Further, according to an aspect of the present invention, the arrangement according to the invention may be used to capture the angular position of the component over the full angular measurement range of 360°, wherein technology for two-dimensional magnetically sensitive sensor elements is used for measuring magnetic fields acting parallel to the sensor plane.

Consequently, the present invention is based on the idea that, in the case of a symmetric arrangement of the magnet and the sensor assembly and a simultaneous symmetric arrangement of the sensor assemblies relative to the axis of rotation, the captured magnetic field in the measuring plane, which preferably is substantially perpendicular to the axis of rotation—the captured magnetic field from the magnetically sensitive elements, through which the axis of rotation extends—is greater in terms of magnitude than that of magnetically sensitive elements arranged at the predetermined distance from the axis of rotation. Using the evaluation unit, the signals of the magnetically sensitive elements arranged at the predetermined distance from the axis of rotation are provided with a different mathematical sign than the signals from the arranged magnetically sensitive elements, through which the axis of rotation extends. Here, in each case, the signal of the magnetically sensitive element arranged on the axis of rotation is respectively linked in a suitable manner to the two magnetically sensitive elements arranged at the predetermined distance from the axis of rotation and the intermediate signals resulting therefrom are thereupon processed by an evaluation element for the purposes of determining a component signal.

Because possible magnetic disturbance/interference fields are predominantly captured in terms of magnitude in a homogeneous direction by all magnetically sensitive elements of a sensor group but the corresponding evaluation element provides the signals with different mathematical signs, the evaluation unit can ultimately compensate or filter out the negative influence of the magnetic disturbance/interference fields on the measurements of the angular positions. Consequently, the influence of the magnetic disturbance/interference field is filtered out by the suitable arrangement of magnetically sensitive elements and by the suitable evaluation of the signals of the magnetically sensitive elements, and consequently an interference field insensitive measurement accuracy of the sensor unit is obtained without delay at all times.

In an advantageous configuration, the evaluation unit comprises a first evaluation element, which is connected to the first magnetically sensitive element and the third magnetically sensitive element and configured to produce a first intermediate signal from the signals of the first magnetically sensitive element and of the third magnetically sensitive element. Moreover, the evaluation unit comprises a second evaluation element, which is connected to the second magnetically sensitive element and the third magnetically sensitive element and configured to produce a second intermediate signal from the signals of the second magnetically sensitive element and of the third magnetically sensitive element.

Further, the evaluation unit has a third evaluation element, which is connected to the fourth magnetically sensitive element and the sixth magnetically sensitive element and configured to produce a third intermediate signal from the signals of the fourth magnetically sensitive element and of the sixth magnetically sensitive element. Moreover, the evaluation unit comprises a fourth evaluation element, which is connected to the fifth magnetically sensitive element and the sixth magnetically sensitive element and configured to produce a fourth intermediate signal from the signals of the fifth magnetically sensitive element and of the sixth magnetically sensitive element.

In a preferred embodiment, the first evaluation element and/or the second evaluation element and/or the third evaluation element and/or the fourth evaluation element are each an analog difference former, which provides the two input signals with different mathematical signs and therefore subtracts the two signals from one another.

In a preferred embodiment, the evaluation unit comprises a fifth evaluation element, which is connected to the first evaluation element and the second evaluation element and configured to produce a first component signal from the first intermediate signal and the second intermediate signal, the first component signal in terms of magnitude corresponding to twice the value along the first direction of the difference of the magnetic field captured by the magnetically sensitive element that extends through the axis of rotation and the magnetic fields captured by the two magnetically sensitive elements arranged at the predetermined distance from the axis of rotation. Further, the evaluation unit comprises a sixth evaluation element, which is connected to the third evaluation element and the fourth evaluation element and configured to produce a second component signal from the third intermediate signal and the fourth intermediate signal, the second component signal in terms of magnitude corresponding to twice the value along the second direction of the difference of the magnetic field captured by the magnetically sensitive element that extends through the axis of rotation and the magnetic fields captured by the two magnetically sensitive elements arranged at the predetermined distance from the axis of rotation. Moreover, the evaluation unit has a seventh evaluation element, which is connected to the fifth evaluation element and the sixth evaluation element and configured to produce the angle signal corresponding to the angular position of the component from the first component signal and the second component signal. Preferably, the fifth evaluation element and/or the sixth evaluation element are an analog sum former, which adds the two input signals to one another.

In an embodiment of the arrangement disclosed herein, a plurality of evaluation elements can be integrated in an evaluation element. By way of example, the first, second and third evaluation element can be integrated in a first evaluation subunit that carries out the functions of the first, second and third evaluation element and consequently produces the first component signal. Similarly, the fourth, fifth and sixth evaluation element can be integrated in a second evaluation subunit that carries out the functions of the fourth, fifth and sixth evaluation element and consequently produces the second component signal.

In a further preferred embodiment, the first component signal is a cosine-shaped signal with respect to the predetermined angle and the second component signal is a sine-shaped signal with respect to the predetermined angle. In this embodiment, the third evaluation element is configured to produce the angle signal corresponding to the angular position of the component by means of an arctangent function from the first component signal and the second component signal.

In a preferred configuration, the first direction (x) extends substantially orthogonal to the second direction (y). In such a configuration, the cosine-shaped first component signal Sy is supplied by the fifth evaluation element and the sine-shaped second component signal Sx is supplied by the sixth evaluation element. Consequently, the seventh evaluation element can determine the angular position of the component rotatable about the axis of rotation using the equation $\varphi=\arctan(Sx/Sy)$, where $Sx\sim\sin(\varphi)$ and $Sy\sim\cos(\varphi)$.

The magnet is preferably a two-pole magnet, which is configured to produce a magnetic field. Preferably, the magnet is a cuboid magnet and arranged in such a way in relation to the axis of rotation that the axis of rotation extends centrally through the magnet and consequently passes the interface between the two poles. In further configurations, the magnet can also have an embodiment with a circular cylindrical shape. Further, the magnet can be configured with a number of poles that is an integer when divided by two.

In an advantageous configuration of the disclosed arrangement, the magnet is fastened to the rotatable component and the sensor assembly has a stationary arrangement relative to the magnet. Consequently, the magnet can rotate with the rotatable component, wherein the sensor assembly captures this rotation and the sensor assembly is able to deduce the angular position of the rotatable component.

In an alternative embodiment of the arrangement, the magnet has a stationary arrangement relative to the sensor assembly and the sensor assembly is fastened to the rotatable component. In such a configuration, the sensor assembly can rotate together with the rotatable component relative to the magnet and the sensor assembly can consequently establish the angular position of the component.

Preferably, the sensor assembly is aligned relative to the axis of rotation in such a way that the measuring plane extends substantially orthogonal to the axis of rotation.

In a further advantageous configuration of the arrangement disclosed herein, at least one of the magnetically sensitive elements is a vertical Hall cell. Further, at least one of the magnetically sensitive elements can be based on the magnetoresistive effect (MR). By way of example, a magnetically sensitive element based on the magnetoresistive effect consists of an anisotropic magnetoresistive (AMR) element, a giant magnetoresistive (GMR) element or a tunnel magnetoresistive (TMR) element.

BRIEF DESCRIPTION OF THE DRAWINGS

Further features and configurations of the arrangement according to the invention will become clear from the following reference to the drawings. In the figures.

DETAILED DESCRIPTION OF THE PRESENTLY PREFERRED EMBODIMENTS

Figure 1:
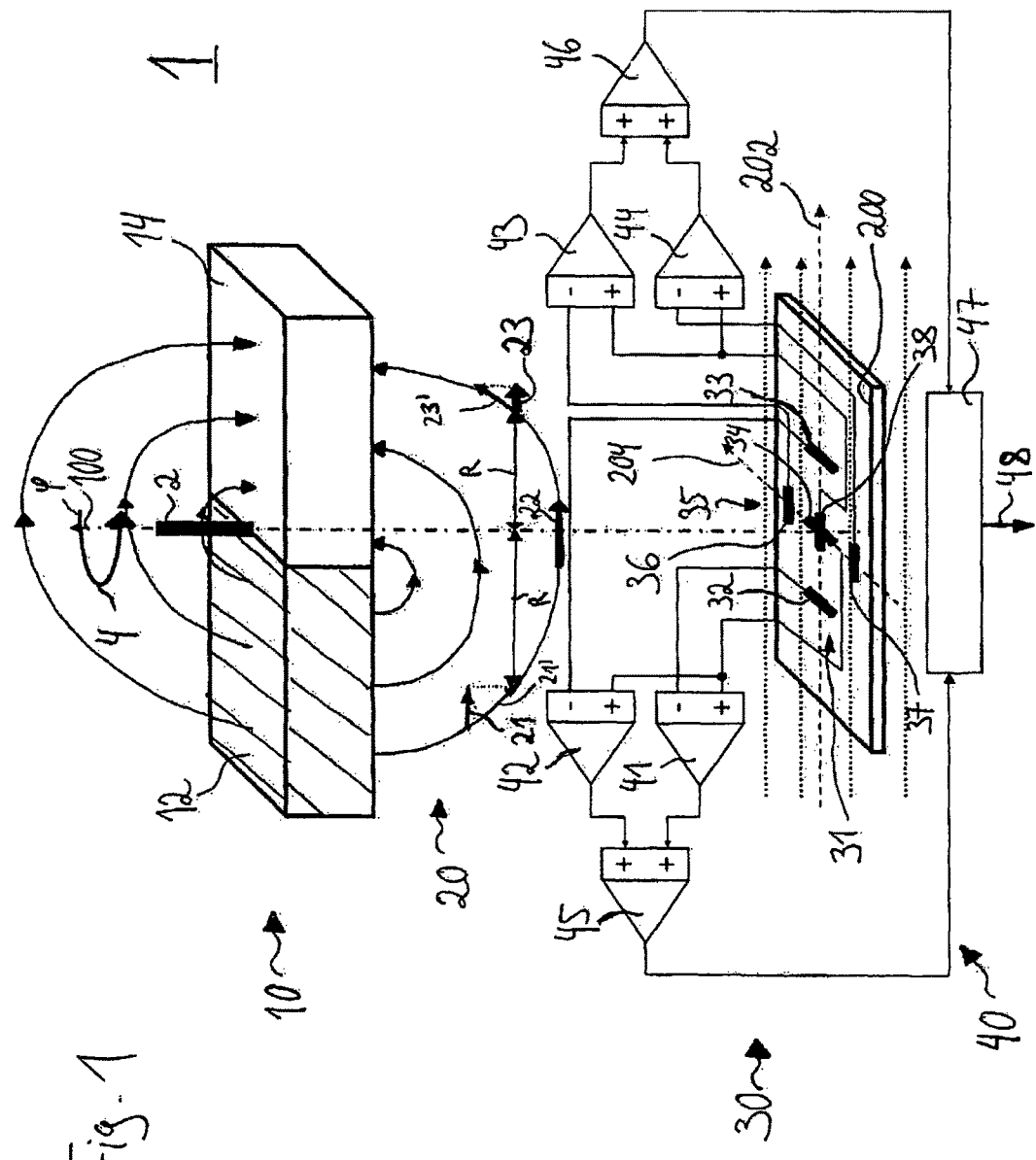
FIG. 1 shows a schematic view of an arrangement according to the invention for capturing the angular position of a component that is rotatable about an axis of rotation.

FIG. 1 shows an embodiment of an arrangement 1 according to the invention for capturing the angular position p of a component 2 that is rotatable about an axis of rotation 100. By way of example, the rotatable component 2 can be a shaft of a rotor of a DC motor. In further exemplary embodiments of the arrangement 1, the rotatable component 2 can be a throttle shaft of a throttle housing of a combustion engine or of an actuator for mechanical adjustment.

The arrangement 1 of FIG. 1 has a magnet 10, which produces a magnetic field 20. In FIG. 1, the magnetic field lines of the magnetic field 20 are plotted schematically. As illustrated in FIG. 1, the magnet 10 has two poles, namely a north pole 12 and a south pole 14. The magnet 10 is arranged in relation to the axis of rotation 100 such that the axis of rotation 100 extends centrally through the magnet 10, in particular through the interface between the north pole 12 and the south pole 14. The component 2 is rotatable about the axis of rotation 100 together with the magnet 10 (see the plotted arrow 4).

The arrangement 1 illustrated in FIG. 1 further has a sensor assembly 30 that is spaced apart from the magnet 10. The sensor assembly 30 is preferably a sensor chip and magnetically sensitive in a measuring plane 200, which is spanned by a first axis 202, for example an x-axis, and a second axis 204 extending orthogonal thereto, for example a y-axis. Consequently, the predetermined angle α between the first axis 202 and the second axis 204 is 90° in the shown embodiment (see FIG. 2). The two axes 202, 204 are each arranged orthogonal to the axis of rotation 100, and so the measuring plane 200 of the sensor assembly 30 consequently extends substantially orthogonal to the axis of rotation 100.

The sensor assembly 30 is embodied to be magnetically sensitive to magnetic field components that extend in the measuring plane 200. Further, the sensor assembly 30 is embodied not to be magnetically sensitive to magnetic field components that extend orthogonal to the measuring plane 200, i.e., consequently do not lie in the measuring plane 200.

In the arrangement 1 illustrated in FIG. 1, the sensor assembly 30 has a stationary arrangement and it is embodied to capture the magnetic field 20 of the magnet 10 and supply an angle signal 48 corresponding to the angular position φ of the component 2 therefrom.

Figure 2:
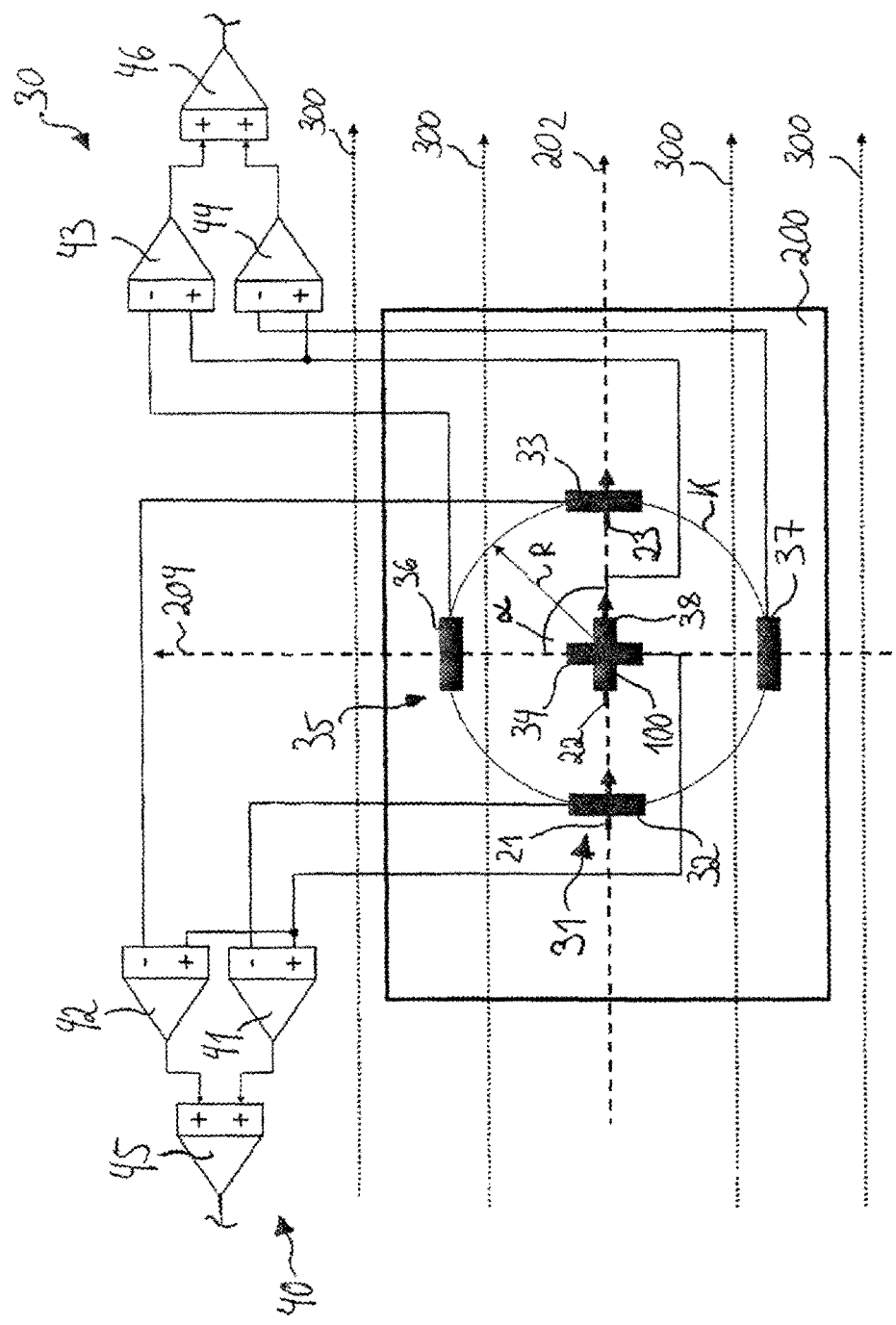
FIG. 2 shows a plan view of a sensor assembly of the arrangement from FIG. 1.

With additional reference to FIG. 2, the sensor assembly 30 has to this end a first sensor group 31 arranged in the measuring plane 200, the first sensor group having a first magnetically sensitive element 32 arranged at a predetermined distance R from the axis of rotation 100, a second magnetically sensitive element 33 arranged opposite to the first magnetically sensitive element 32 relative to the axis of rotation 100, the second magnetically sensitive element likewise being arranged at the predetermined distance R from the axis of rotation 100, and a third magnetically sensitive element 34 arranged centrally between the first magnetically sensitive element 32 and the second magnetically sensitive element 33 and consequently likewise extends through the axis of rotation 100. The first magnetically sensitive element 32, the second magnetically sensitive element 33 and the third magnetically sensitive element are each configured to capture those magnetic field components of the magnetic field 20 that extend in the direction of the first axis 202.

Further, the sensor assembly 30 has a second sensor group 35 in the measuring plane 200, the second sensor group having a fourth magnetically sensitive element 36 arranged at the predetermined distance R from the axis of rotation 100, a fifth magnetically sensitive element 37 arranged opposite to the fourth magnetically sensitive element 36 relative to the axis of rotation 100, the fifth magnetically sensitive element being arranged at the predetermined distance R from the axis of rotation 100, and a sixth magnetically sensitive element 38 arranged centrally between the fourth magnetically sensitive element 32 and the fifth magnetically sensitive element 33 and consequently likewise extends through the axis of rotation 100. The fourth magnetically sensitive element 36, the fifth magnetically sensitive element 37 and the sixth magnetically sensitive element 38 are each configured to capture those magnetic field components of the magnetic field 20 that extend in the direction of the second axis 204.

As can be gathered from FIG. 2, the first magnetically sensitive element 32, the second magnetically sensitive element 33, the fourth magnetically sensitive element 36 and the fifth magnetically sensitive element 37 are arranged in a circular fashion on a circle K with the radius R, this circle being arranged in the measuring plane 200 and the center of the circle lying on the axis of rotation 100. The third magnetically sensitive element 34 and the sixth magnetically sensitive element 38 are arranged on the center of the circle K and are rotated relative to one another through the angle α.

Further, the sensor assembly 30 comprises an evaluation unit 40, connected to the magnetically sensitive elements 32, 33, 34 of the first sensor group 31 and to the magnetically sensitive elements 36, 37, 38 of the second sensor group 35 and configured to supply the angle signal 48 corresponding to the angular position p of the component 2. The connection of the evaluation unit 40 with the magnetically sensitive elements 32, 33, 34, 36, 37, 38 of the respective first and second sensor group 31, 35 can be realized by suitable connecting lines, for example wires (illustrated using full lines in FIG. 1). In further configurations of the arrangement 1, the connections of the evaluation unit 40 with the magnetically sensitive elements 32, 33, 34, 36, 37, 38 of the respective first and second sensor group 31, 35 can also be realized in wireless fashion, for example by a suitable radio connection.

In further configurations, further evaluation circuits can be inserted between the magnetically sensitive elements and the evaluation elements in order to suppress cross-influences such as temperature dependences and mechanical stress sensitivities. By way of example, modulation and demodulation circuits can be arranged between the magnetically sensitive elements and evaluation elements.

Further, the magnetically sensitive elements can be constructed from a plurality of individual elements, such as, e.g., Hall cells and/or 2-fold or 4-fold bridge circuits, from individual magnetoresistive individual resistors. Moreover, the evaluation elements can contain further evaluation circuits.

The evaluation unit 40 has a first evaluation element 41, which is connected to the first magnetically sensitive element 32 and the third magnetically sensitive element 34 and configured to produce a first intermediate signal from the signals of the first magnetically sensitive element 32 and of the third magnetically sensitive element 34. Further, the evaluation unit 40 comprises a second evaluation element 42, which is connected to the second magnetically sensitive element 33 and the third magnetically sensitive element 34 and configured to produce a second intermediate signal from the signals of the second magnetically sensitive element 33 and of the third magnetically sensitive element 34.

Moreover, the evaluation unit 40 comprises a third evaluation element 43, which is connected to the fourth magnetically sensitive element 36 and the sixth magnetically sensitive element 38 and configured to produce a third intermediate signal from the signals of the fourth magnetically sensitive element 36 and of the sixth magnetically sensitive element 38. Further, the evaluation unit 40 comprises a fourth evaluation element 44, which is connected to the fifth magnetically sensitive element 37 and the sixth magnetically sensitive element 38 and configured to produce a fourth intermediate signal from the signals of the fifth magnetically sensitive element 37 and of the sixth magnetically sensitive element 38.

In the embodiment illustrated in FIGS. 1 and 2, the intermediate signals of the evaluation elements 41, 42, 43, 44 are difference signals in each case, which represent the differences of the respective signals of the magnetically sensitive elements.

For the purposes of processing the plurality of intermediate signals (or difference signals) further, the evaluation unit 40 comprises a fifth evaluation element 42 and a sixth evaluation element 46. The fifth evaluation element 45 is connected to the first evaluation element 41 and the second evaluation element 42 and configured to produce a first component signal from the first intermediate signal and the second intermediate signal, the first component signal corresponding to twice the value of the difference between the magnetic field the 20 captured by the third magnetically sensitive element 34 and, in each case, the magnetic field 20 captured by the first and second magnetically sensitive element 32, 33 along the first axis 202. The sixth evaluation element 46 is connected to the third evaluation element 43 and the fourth evaluation element 44 and configured to produce a second component signal from the third intermediate signal and the fourth intermediate signal, the second component signal corresponding to twice the value of the difference between the magnetic field the 20 captured by the sixth magnetically sensitive element 38 and, in each case, the magnetic field 20 captured by the fourth and fifth magnetically sensitive element 36, 37 along the first axis 202.

The evaluation unit 40 further comprises a seventh evaluation element 47, which is connected to the fifth evaluation element and the sixth evaluation element 46 and configured to produce the angle signal 48 corresponding to the angular position φ of the component 2 from the first component signal and the second component signal.

In a preferred embodiment as shown in FIGS. 1 and 2, the fifth evaluation element 45 and/or the sixth evaluation element 46 are an analog sum former, which in each case adds the two input signals. Moreover, the first evaluation element 41, the second evaluation element 42, the third evaluation element 43 and/or the fourth evaluation element 44 preferably are an analog difference former, which subtracts the two signals of the magnetically sensitive elements.

As indicated in FIGS. 1 and 2 and as already explained above, the first evaluation element 41, the second evaluation element 42, the third evaluation element 43 and the fourth evaluation element 44 each are difference formers, which in each case assign different mathematical signs to the incoming signals from the two corresponding magnetically sensitive elements and consequently form the difference. The difference formers can be analog or digital in each case.

In FIGS. 1 and 2, magnetic field components 21', 22, 23' are illustrated in an exemplary manner, the magnetic field components in each case corresponding to the components along the first axis 202. The magnetic field components 21', 22, 23' that are projected in an exemplary manner onto the measuring plane 200 in each case originate from the magnetic field 20 and are captured by the magnetically sensitive elements 32, 33, 34 of the first sensor group 31 and the magnetically sensitive elements 36, 37, 38 of the second sensor group 35, wherein the magnetic field components 21, 22, 23 do not have a value along the second axis 204 in the shown position and, consequently, the magnetically sensitive elements 36, 37, 38 of the second sensor group 35 supply no signals in each case. The magnetic field components 21', 22, 23' represent vectors and are of equal size in terms of absolute magnitude, i.e., the length of these vectors is of equal length but the respective alignment is different. In FIG. 1, the components parallel to the axis of rotation 100 are indicated schematically with the dotted lines at the magnetic field components 21' and 23' (vector decomposition). The magnetic field components 21 and 23 represent the components parallel to the first axis 202.

With additional reference to FIG. 1, the magnetic field component 22 is a component that extends substantially orthogonal to the axis of rotation 100 and that is consequently substantially parallel to the measuring plane 200. Consequently, the component 22 only has one component in the measuring plane 200 (specifically parallel to the first axis 202), but no components parallel to the axis of rotation 100 or parallel to the second axis 204.

The magnetic field components 21 and 22 extending parallel to the first axis 202 are plotted in an exemplary manner at the distance R from the axis of rotation 100 (see FIG. 1); on account of the curved magnetic field 200, the projected magnetic field components 21, 23 captured in the measuring plane 200 by the magnetically sensitive elements 32 and 33 are smaller in terms of absolute value than the magnetic field component 22 captured by the magnetically sensitive element 34.

The first evaluation element 41 is configured in the form of a difference former and it assigns different mathematical signs to the signals of the first magnetically sensitive element 32 and of the third magnetically sensitive element 34. Similarly, the second evaluation element 42 configured in the form of a difference former assigns different mathematical signs to the signals of the second magnetically sensitive element 33 and of the third magnetically sensitive element 34. The fifth evaluation element 45 adds the difference signals of the first evaluation element 42 and of the second evaluation element 42 and produces a cosine-shaped first component signal in relation to the predetermined angle $\alpha$ therefrom.

Two difference signals, which are subsequently added, are formed for reasons of symmetry and for obtaining a double used signal. By way of example, if the axis of rotation 100 displaces slightly from the center of the circle K in the direction of the axis 202, the difference signal 42 becomes weaker and the second complementary difference signal 41 becomes stronger. Consequently, the produced sum signal remains substantially unchanged after the evaluation element 45 and the angular position $\varphi$ of the component 2 can continue to be established with the disturbance field removed therefrom.

Similarly, the third evaluation element 43 and the fourth evaluation element 44 evaluate the signals produced by the magnetically sensitive elements 36, 37, 38 of the second sensor group 35 that are arranged along the second axis 204, so that the sixth evaluation element 46 produces a sine-shaped second component signal in relation to the predetermined angle $\alpha$ therefrom.

With knowledge of the angle $\alpha$ between the first axis 202 and the second axis 204, the third evaluation element 46 is thereupon able to supply the angle signal 47 corresponding to the angular position p of the component 2. In particular, the seventh evaluation element 47 is embodied to process the component signals of the fifth and sixth evaluation element 45, 46 and evaluate these by an arctangent function in such a way that the angular position p of the rotatable component 2 can be established. Consequently, in the case of a full-circle rotation of the component 2, the angle signal 48 produced thus is uniquely mapped and the measurement range is 0° to 360°.

In FIGS. 1 and 2, a magnetic disturbance/interference field 300 that extends parallel to the measuring plane 200 is plotted in an exemplary manner; the disturbance/interference field substantially extending in the positive direction parallel to the first axis 202. Consequently, the magnetic disturbance/interference field 300 increases in terms of absolute value the magnetic field components 21, 22, 23 captured by the magnetically sensitive elements 32, 33, 34, and so the input signals into the evaluation elements 41, 42 are elevated in each case by the magnetic disturbance/interference field 300. The influence of the interference field 300 is filtered out or compensated in each case due to fact that the evaluation elements 41, 42 in the illustrated embodiment are configured as difference formers, which in each case subtract the signals of the magnetically sensitive elements 32, 33 from the signal of the magnetically sensitive element 34. Consequently, the disturbance field has been removed in each case from the two different signals of the evaluation elements 41, 42 and these can consequently be processed further to form the first component signal by the fifth evaluation element 45.

The disturbance field is removed in a similar manner in the evaluation elements 43, 44, and so the second component signal of the sixth evaluation element 46 is not falsified by the magnetic disturbance/interference field 300 either.

In conclusion, the arrangement 1 according to FIGS. 1 and 2 renders it possible to compensate external magnetic disturbance/interference fields 300 present by way of a suitable evaluation of the signals from the magnetically sensitive elements 32, 33, 34, 36, 37, 38 and consequently renders it possible to increase the measurement accuracy of the sensor unit 30.

Thus, using the arrangement 1 according to the invention, it is possible to reliably capture the angular position $\varphi$ of the rotatable component 2 both uniquely and virtually in real time over an angle range of 360°. This is particularly advantageous in the case of brushless DC motors since the arrangement 1 can capture the angular position $\varphi$ of the rotor at all times without delay, as accurately as possible and without disturbance by magnetic disturbance/interference fields.

Thus, while there have been shown and described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

The invention claimed is:

1. An assembly (1) for capturing an angular position ($\varphi$) of a component (2) that is rotatable about an axis of rotation (100), the assembly (1) comprising:
a magnet (10) configured to produce a magnetic field (20); and
a sensor assembly (30) spaced apart from the magnet (10) and configured to capture the magnetic field (20) in a measuring plane (200) that extends substantially orthogonal to the axis of rotation (100) and to supply an angle signal (48) that corresponds to the angular position ($\varphi$) of the component (2) therefrom, wherein the magnet (10) or the sensor assembly (30) is arranged to be rotatable about the axis of rotation (100), the sensor assembly (30) including:
a first sensor group (31) arranged in the measuring plane (200), the first sensor group comprising a first magnetically sensitive element (32) arranged at a predetermined distance (R) from the axis of rotation (100), a second magnetically sensitive element (33) arranged opposite to the first magnetically sensitive element (32) relative to the axis of rotation (100), the second magnetically sensitive element being arranged at the predetermined distance from the axis of rotation (100), and a third magnetically sensitive element (34) arranged centrally between the first magnetically sensitive element (32) and the second magnetically sensitive element (33), wherein the first magnetically sensitive element (32), the second magnetically sensitive element (33) and the third magnetically sensitive element (34) are: (a) each arranged parallel to one another, and (b) each configured to capture the magnetic field (20) along a first direction (202), a second sensor group (35) arranged in the measuring plane (200), the second sensor group comprising a fourth magnetically sensitive element (36) arranged at the predetermined distance (R) from the axis of rotation (100), a fifth magnetically sensitive element (37) arranged opposite to the fourth magnetically sensitive element (36) relative to the axis of rotation (100), the fifth magnetically sensitive element being arranged at the predetermined distance from the axis of rotation (100), and a sixth magnetically sensitive element (38) arranged centrally between the fourth magnetically sensitive element (36) and the fifth magnetically sensitive element (37), wherein the fourth magnetically sensitive element (36), the fifth magnetically sensitive element (37) and the sixth magnetically sensitive element (38) are: (a) each arranged parallel to one another, and (b) each configured to capture the magnetic field (20) along a second direction (204) that extends at a predetermined angle ($\alpha$) with respect to the first direction (202), and an evaluation unit (40), which is connected to the magnetically sensitive elements (32, 33, 34) of the first sensor group (31) and to the magnetically sensitive elements (36, 37, 38) of the second sensor group (35) and configured to supply the angle signal (48) corresponding to the angular position ($\varphi$) of the component (2), wherein the third magnetically sensitive element (34) and the sixth magnetically sensitive element (38) are arranged so as to overlap one another in an overlap region, and wherein the axis of rotation (100) passes through the overlap region, wherein, in a top down view with respect to the measuring plane (200), of the first, second, third, fourth, fifth and sixth magnetically sensitive elements, only the third and the sixth magnetically sensitive elements overlap one another.

2. The assembly (1) as claimed in claim 1, wherein the evaluation unit (40) comprises:

a first evaluation element (41), which is connected to the first magnetically sensitive element (32) and the third magnetically sensitive element (34) and configured to produce a first intermediate signal from signals of the first magnetically sensitive element (32) and of the third magnetically sensitive element (34), a second evaluation element (42), which is connected to the second magnetically sensitive element (33) and the third magnetically sensitive element (34) and configured to produce a second intermediate signal from signals of the second magnetically sensitive element (33) and of the third magnetically sensitive element (34), a third evaluation element (43), which is connected to the fourth magnetically sensitive element (36) and the sixth magnetically sensitive element (38) and configured to produce a third intermediate signal from signals of the fourth magnetically sensitive element (36) and of the sixth magnetically sensitive element (38), and a fourth evaluation element (44), which is connected to the fifth magnetically sensitive element (37) and the sixth magnetically sensitive element (38) and configured to produce a fourth intermediate signal from signals of the fifth magnetically sensitive element (37) and of the sixth magnetically sensitive element (38).

3. The assembly (1) as claimed in claim 2, wherein the evaluation unit (40) further comprises:

a fifth evaluation element (45), which is connected to the first evaluation element (41) and the second evaluation element (42) and configured to produce a first component signal from the first intermediate signal and the second intermediate signal, a sixth evaluation element (46), which is connected to the third evaluation element (43) and the fourth evaluation element (44) and configured to produce a second component signal from the third intermediate signal and the fourth intermediate signal, and a seventh evaluation element (47), which is connected to the fifth evaluation element (45) and the sixth evaluation element (46) and configured to produce the angle signal (48) corresponding to the angular position ($\varphi$) of the component (2) from the first component signal and the second component signal.

4. The assembly (1) as claimed in claim 3, wherein the fifth evaluation element (45) and/or the sixth evaluation element (46) comprise an addition former.

5. The assembly (1) as claimed in claim 4, wherein the first evaluation element (41) and/or the second evaluation element (42) and/or the third evaluation element (43) and/or the fourth evaluation element (44) comprise a difference former.

6. The assembly (1) as claimed in claim 5, wherein the first component signal is a cosine-shaped signal with respect to the predetermined angle ($\alpha$), the second component signal is a sine-shaped signal with respect to the predetermined angle ($\alpha$) and the seventh evaluation element (47) is configured to produce the angle signal (48) corresponding to the angular position ($\varphi$) of the component (2) by an arctangent function from the first component signal and the second component signal.

7. The assembly (1) as claimed in claim 1, wherein the magnet (10) comprises a number of poles, the number of poles of the magnet (10) being divisible by two as an integer.

8. The assembly (1) as claimed in claim 7, wherein the magnet (10) is fastened to the rotatable component (2) and the sensor assembly (30) has a stationary arrangement relative to the magnet (10).

9. The assembly (1) as claimed claim 7, wherein the magnet (10) has a stationary arrangement relative to the sensor assembly (30) and the sensor assembly (30) is fastened to the rotatable component (2).

10. The assembly (1) as claimed in in claim 1, wherein the measuring plane (200) extends substantially orthogonal to the axis of rotation (100).

* * * * *